United States Patent
Veloo et al.

(10) Patent No.: US 7,319,304 B2
(45) Date of Patent: Jan. 15, 2008

(54) SHUNT CONNECTION TO A PCB OF AN ENERGY MANAGEMENT SYSTEM EMPLOYED IN AN AUTOMOTIVE VEHICLE

(75) Inventors: Balaguru K. Veloo, Gurnee, IL (US); Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 514 days.

(21) Appl. No.: 10/897,801

(22) Filed: Jul. 23, 2004

(65) Prior Publication Data

US 2005/0057865 A1 Mar. 17, 2005

Related U.S. Application Data

(60) Provisional application No. 60/490,153, filed on Jul. 25, 2003.

(51) Int. Cl.
*H02J 7/00* (2006.01)
*B23P 19/00* (2006.01)

(52) U.S. Cl. .................... 320/134; 29/730; 29/840; 29/834; 320/132; 320/136; 702/63

(58) Field of Classification Search .............. 29/246, 29/730, 763, 832, 840, 407.1, 593, 834; 318/139; 320/132, 134, 136, 150, DIG. 18; 324/426–429; 340/636.12, 635; 361/54, 56, 57; 702/63; 72/63
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 20/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Minh Trinh
*Assistant Examiner*—Donghai D. Nguyen
(74) *Attorney, Agent, or Firm*—Westman, Champlin & Kelly

(57) ABSTRACT

A method of coupling a shunt to a printed circuit board (PCB) of an energy management system is provided. The method includes coupling flexible electrical connectors to the shunt and soldering the flexible electrical connectors to connection points on the PCB of the energy management system. An energy management system that includes a shunt coupled to a printed circuit board using the above method is also provided.

8 Claims, 12 Drawing Sheets

U.S. PATENT DOCUMENTS

| | | | |
|---|---|---|---|
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 324/503 |
| 4,217,645 A | 8/1980 | Barry et al. | 702/63 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 320/116 |
| 4,322,685 A | 3/1982 | Frailing et al. | 324/429 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et al. | 324/772 |
| 4,514,694 A | 4/1985 | Finger | 324/429 |
| 4,520,353 A | 5/1985 | McAuliffe | 340/636 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,888,716 A | 12/1989 | Ueno | 702/63 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,313,152 A | 5/1994 | Wozniak et al. | 320/118 |
| 5,315,287 A | 5/1994 | Sol | 340/455 |
| 5,321,626 A | 6/1994 | Palladino | 702/63 |
| 5,321,627 A | 6/1994 | Reher | 364/483 |
| 5,323,337 A | 6/1994 | Wilson et al. | 364/574 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |
| 5,365,453 A | 11/1994 | Startup et al. | 320/136 |

| Patent | Date | Inventor | Class |
|---|---|---|---|
| 5,381,096 A | 1/1995 | Hirzel | 324/427 |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 320/DIG. 21 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/152 |
| 5,650,937 A | 7/1997 | Bounaga | 702/6 |
| 5,652,501 A | 7/1997 | McClure et al. | 320/118 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 320/161 |
| 5,661,368 A | 8/1997 | Deol et al. | 315/82 |
| 5,675,234 A | 10/1997 | Greene | 320/DIG. 18 |
| 5,677,077 A | 10/1997 | Faulk | 429/90 |
| 5,699,050 A | 12/1997 | Kanazawa | 340/636 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,031,368 A | 2/2000 | Klippel et al. | 324/133 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |

| | | | |
|---|---|---|---|
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,062 B1 * | 10/2001 | Batson | 320/134 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/426 |
| 6,396,278 B1 | 5/2002 | Makhija | 324/402 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,495,990 B2 | 12/2002 | Champlin | 320/132 |
| 6,526,361 B1 | 2/2003 | Jones et al. | 702/63 |
| 6,531,848 B1 | 3/2003 | Chitsazan et al. | 320/153 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B2 | 9/2003 | Bean | 700/231 |
| 6,628,011 B2 | 9/2003 | Droppo et al. | 307/43 |
| 6,629,054 B2 | 9/2003 | Makhija et al. | 702/113 |
| 6,667,624 B1 | 12/2003 | Raichle et al. | 324/522 |
| 6,679,212 B2 | 1/2004 | Kelling | 123/179.28 |
| 2002/0010558 A1 | 1/2002 | Bertness et al. | 702/63 |
| 2002/0030495 A1 | 3/2002 | Kechmire | 324/427 |
| 2002/0050163 A1 | 5/2002 | Makhija et al. | 73/116 |
| 2002/0171428 A1 | 11/2002 | Bertness | 324/426 |
| 2002/0176010 A1 | 11/2002 | Wallach et al. | 348/362 |
| 2003/0025481 A1 | 2/2003 | Bertness | 324/427 |
| 2003/0184262 A1 | 10/2003 | Makhija | 320/130 |
| 2003/0184306 A1 | 10/2003 | Bertness et al. | 324/426 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| GB | 2 246 916 A | 10/1990 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| JP | 09061505 | 3/1997 |
| JP | 10056744 | 2/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/62049 | 10/2000 |
| WO | WO 00/67359 | 11/2000 |
| WO | WO 01/59443 | 2/2001 |
| WO | WO 01/51947 | 7/2001 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"Battery Impedance", by E. Willihnganz et al., *Electrical Engineering*, Sep. 1959, pp. 922-925.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, undated, date not known.

"#12: LM78S40 Simple Switcher DC to DC Converter", *ITM e-Catalog*, downloaded from http://www.pcbcafe.com, undated, date not known.

"Simple DC-DC Converts Allows Use of Single Battery", *Electronix Express*, downloaded from http://www.elexp.com/t_dc-dc.htm, undated, date not known.

"DC-DC Converter Basics", *Power Designers*, downloaded from http://www.powederdesigners.com/InforWeb.design_center/articles/DC-DC/converter.shtm, undated, date not known.

"Notification of Transmittal of The International Search Report or the Declaration", PCT/US02/29461, Mar. 1, 2003.

"Notification of Transmittal of The International Search Report or the Declaration", PCT/US03/07546, Sep. 4, 2003.

"Notification of Transmittal of The International Search Report or the Declaration", PCT/US03/06577, Jul. 25, 2003.

"Notification of Transmittal of The International Search Report or the Declaration", PCT/US03/07837, Sep. 4, 2003.

"Notification of Transmittal of The International Search Report or the Declaration", PCT/US03/41561, May 10, 2004.

"Notification of Transmittal of The International Search Report or the Declaration", PCT/US03/27696, Apr. 13, 2004.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

* cited by examiner

SHUNT CONNECTION TO A PCB OF AN ENERGY MANAGEMENT SYSTEM EMPLOYED IN AN AUTOMOTIVE VEHICLE

CROSS REFERENCE TO RELATED APPLICATION

This application claims priority of U.S. Provisional Application No. 60/490,153, filed Jul. 25, 2003 and entitled "SHUNT CONNECTION TO A PCB FOR AN ENERGY MANAGEMENT SYSTEM EMPLOYED IN AN AUTOMOTIVE VEHICLE".

BACKGROUND OF THE INVENTION

The present invention relates to automotive vehicles. More specifically, the present invention relates to a connecting a shunt to a printed circuit board (PCB) of an energy management system employed in an automotive vehicle.

Automotive vehicles powered by combustion engines typically include a battery. The battery is used to power the electrical system when the engine is not running. Additionally, the engine used to charge the battery. The engine is also used to power electrical components of the vehicle when the engine is running.

Vehicles contain charging systems, simply referred to as an "alternator," which are powered by the engine and used to charge the battery. Recently, an energy management and monitor system, configured to electrically couple to the alternator and to the battery, has been developed to control the charge signal provided by the alternator to the battery. The energy management system includes components such as capacitors, resistors, transistors, a small microprocessor, etc. These components are mounted on a PCB and the energy management system is included within the electrical system of the vehicle. Also included in the energy management system, is a shunt current sensor, which is used to provide a monitor of the total current flowing through the vehicle battery. The shunt includes a resistor and first and second bus bars, which are connected to a first and second end of the shunt resistor, respectively. The shunt is electrically coupled to the energy management system circuitry, which, as mentioned above, primarily includes components that are mounted on the PCB of the energy management system.

One present technique for coupling the shunt to the PCB of the energy management system includes utilizing screws to mechanically couple, and to electrically connect, bus bars of the shunt to connection points on the PCB. However, this technique for connecting the shunt to the PCB is complex to carry out and typically requires manual assembly.

SUMMARY OF THE INVENTION

A method of coupling a shunt to a printed circuit board (PCB) of an energy management system is provided. The method includes coupling flexible electrical connectors to the shunt and soldering the flexible electrical connectors to connection points on the PCB of the energy management system. This allows for shunt expansion and contraction due to temperature changes while maintaining proper connection to the PCB. An energy management system that includes a shunt coupled to a printed circuit board using the above method is also provided.

DETAILED DESCRIPTION OF THE PREFERRED EMBODIMENTS

The present invention offers a technique for a coupling a shunt (utilized for current measurement) to a printed circuit board (PCB) of an energy management system employed in an automotive vehicle. The technique includes utilizing flexible electrical connectors to couple the shunt to the PCB of the energy management system. This allows for shunt expansion and contraction, due to temperature changes, while maintaining connection to the PCB. To provide a clear understanding of the present invention, the energy management system, with its components, is first described. Thereafter, details regarding connecting the shunt to the PCB of the energy management system are provided. It should be noted that, for simplification, the energy management system PCB has been excluded from figures that do not explicitly show techniques for coupling the shunt to the PCB.

Figure 1:
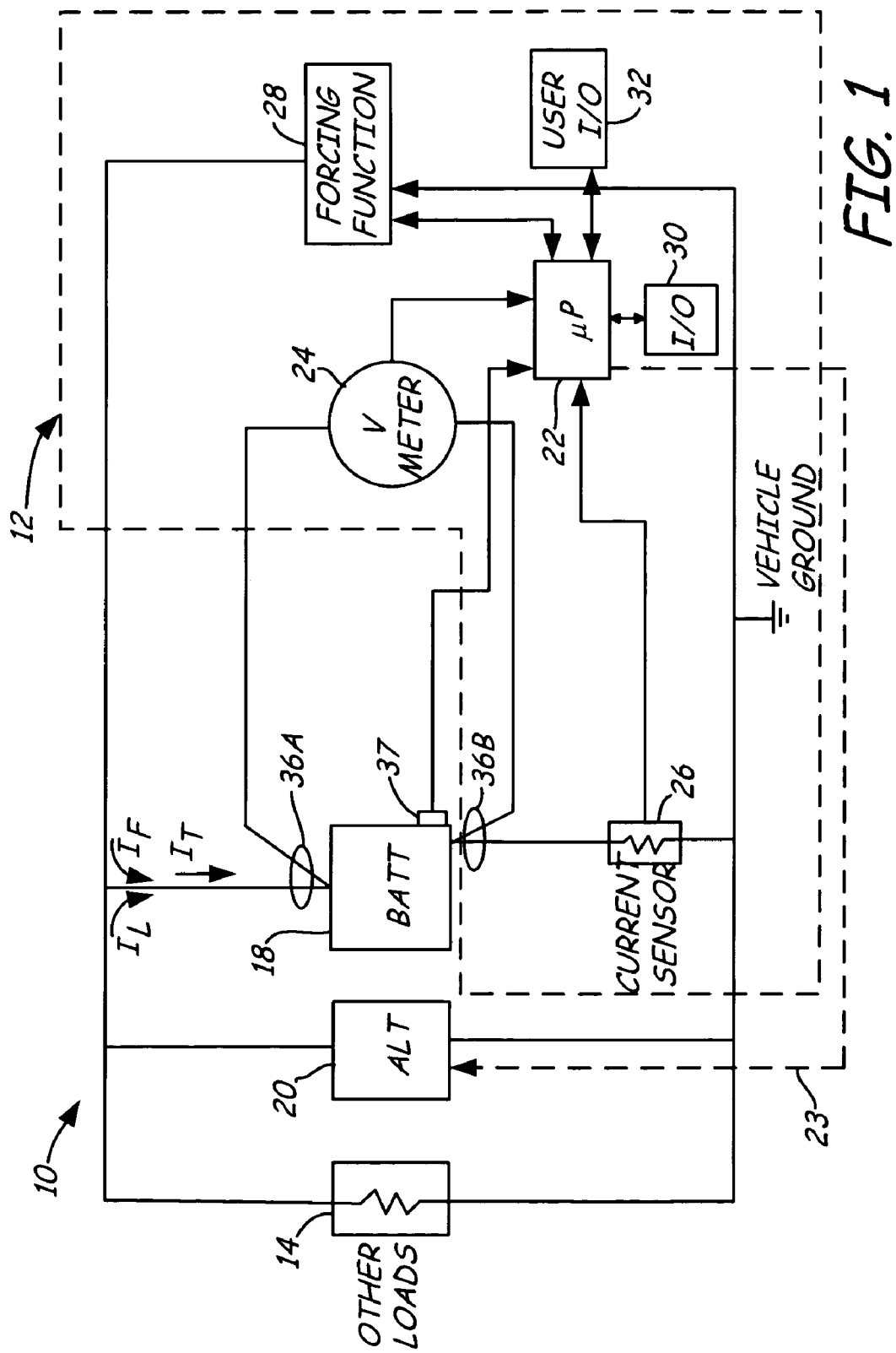
FIG. 1 is a simplified block diagram showing a battery monitor or energy management system in a vehicle.

FIG. 1 is a simplified block diagram showing an automotive vehicle 10, which includes a battery monitor or energy management system 12. Vehicle 10 includes vehicle loads 14, which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In the embodiment illustrated in FIG. 1, battery monitor 12 includes a microprocessor 22 coupled to a voltage sensor 24, a current sensor 26 and a forcing function 28. Microprocessor 22 may also include one or more inputs and outputs illustrated as I/O 30 adapted to couple to an external databus or to an internal databus associated with the vehicle 10. Further, a user input/output (I/O) 32 is provided for providing interaction with a vehicle operator. In one embodiment, microprocessor 22 is coupled to alternator 20 to provide a control output 23 to alternator 20 in response to inputs, alone or in various functional combinations, from current sensor 26, voltage sensor 24 and forcing function 28. In one embodiment, the control output 23 is configured to control alternator 20 such that a nominal voltage output from alternator 20 is 12.6 volts, typical of the nominal open-circuit voltage of the battery 18. Further, microprocessor 22 can raise the output voltage from alternator 20 in accordance with an inverse relationship to the state of charge of battery 18. This can be configured such that alternator 20 only charges battery 18 when necessary, and only charges battery 18 as much as is necessary. This charging technique can increase battery life, lower component temperature of loads 14, increase the lifespan of loads 14 and save fuel. This configuration provides a feedback mechanism in which the state of charge of battery 18 is used to control the charging of battery 18. The battery monitor 12 is easily installed in a vehicle electrical system. A single shunt current sensor 26 must be inserted in one of the primary battery cables and a control line provided to allow control of alternator 20. The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle, except in some embodiments, alternator 20.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10. In one aspect, the present invention includes an in-vehicle battery monitor 12 which couples to battery 18 through a Kelvin connection and further may optionally include a current sensor 26 and may be capable of monitoring battery condition while the engine of vehicle 12 is operated, loads 14 are turned on and/or alternator 20 is providing a charge signal output to charge battery 18. In one particular embodiment, the combination of the Kelvin connection formed by connections 36A and 36B along with a separate current sensor 26 connected in series with the electrical system of the vehicle 10 is provided and allows monitoring of the condition of battery 18 during operation of vehicle 10. Current sensor 26 is used to provide a monitor of the total current $I_T$ flowing through battery 18.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references which are incorporated herein by reference U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; and U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/767,945, filed Jan. 29, 2004, entitled ELECTRONIC BATTERY TESTER; U.S. Ser. No. 10/783,682, filed Feb. 20, 2004, entitled REPLACEABLE CLAMP FOR ELECTRONIC BATTERY TESTER; U.S. Ser. No. 60/548,513, filed Feb. 27, 2004, entitled WIRELESS BATTERY MONITOR; U.S. Ser. No. 10/791,141, filed Mar. 2, 2004, entitled METHOD AND APPARATUS FOR AUDITING A BATTERY TEST; U.S. Ser. No. 60/557,366, filed Mar. 29, 2004, entitled BATTERY MONITORING SYSTEM WITHOUT CURRENT MEASUREMENT; U.S. Ser. No. 10/823,140, filed Apr. 13, 2004, entitled THEFT PREVENTION DEVICE FOR AUTOMOTIVE VEHICLE SERVICE CENTERS.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$, through battery 18 is due to both the forcing function current $I_F$ and the current flowing through loads 14, $I_L$. Current sensor 26 is positioned to sense the total current $I_T$. One example battery dynamic parameter, the dynamic conductance (or reciprocally the battery resistance) can be calculated as:

$$\Delta G = \Delta I_T / \Delta V \qquad \text{Equation 1}$$

where $\Delta V$ is the change in voltage measured across the battery 18 by voltage sensor 24 and $\Delta I_T$ is the change in total current measured flowing through battery 18 using current sensor 26. Note that Equation 1 uses current and voltage differences. In one embodiment, the change in voltage and change in current are measured over a period of 12.5 seconds and at a rate of 50 msec to thereby provide a total of 20 readings for $\Delta V$ and $\Delta I_T$ every second. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

In one embodiment, the voltage and current sensors provide synchronized operation, within one microsecond, and are substantially immune to measurement errors due to network propagation delays or signal line inductance. Furthermore, microprocessor 22 can detect a failure of the voltage regulator and alternator 20 if the voltage output exceeds or drops below predetermined threshold levels. This information can be provided to an operator through user interface 32, for example, a "service regulator soon" indication.

A temperature sensor 37 is provided which can be coupled directly to one of the terminals of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 µohms and current through the shunt is determined by measuring the voltage drop across the shunt. The change of voltage across the battery and the resultant change in current through the battery is sampled using, for example, one or more analog to digital converters. This information can be correlated to determine the total capacity, such as the total Cold Cranking Amp (CCA) capacity of the battery.

Note that during the measurement cycle, vehicle loads 14 may be applied unexpectedly causing noise to be present in the measurements. One technique which might be considered to reduce the noise is to discard those samples which are outside of a predetermined or adjustable window or are outside of the dynamic range of the analog to digital converter. However, quite unexpectedly it has been found that the accuracy of measurements can be increased by increasing the dynamic range of the analog to digital converters, at the expense of the accuracy of the samples obtained from the converter. By averaging all of the samples, even those which are statistically large or small relative to other samples, the present invention is capable of providing accurate voltage and current measurements even in a noisy environment. By averaging samples, and providing sufficient dynamic range for the analog to digital converter, no samples will be discarded and errors in the measurements will tend to cancel against other errors.

In general, the present invention uses the direct relationship between the dynamic conductance of the battery and the condition of the battery. For example, if a battery drops more than 15% below its rated capacity, microprocessor 22 can provide an output which indicates that the battery 18 should be replaced. Further, the conductance can be used to determine the charge level of the battery. Such a measurement can be augmented to improve accuracy by monitoring the total current flowing into battery 18, or out of battery 18, using current sensor 26. The voltage across the battery 18 can also be used to determine the charge used in the determination of charge level. In general, the state of charge can be determined as a function of various combinations either alone or together of battery state of health, temperature, charge balance (charge going into and out of the battery), charging efficiency and initial conditions such as the battery construction, manufacture, plate configuration or other conditions of the battery. The functional relationship can be determined by characterizing multiple batteries or through the use of artificial intelligence techniques such as neural networks.

Figure 2:
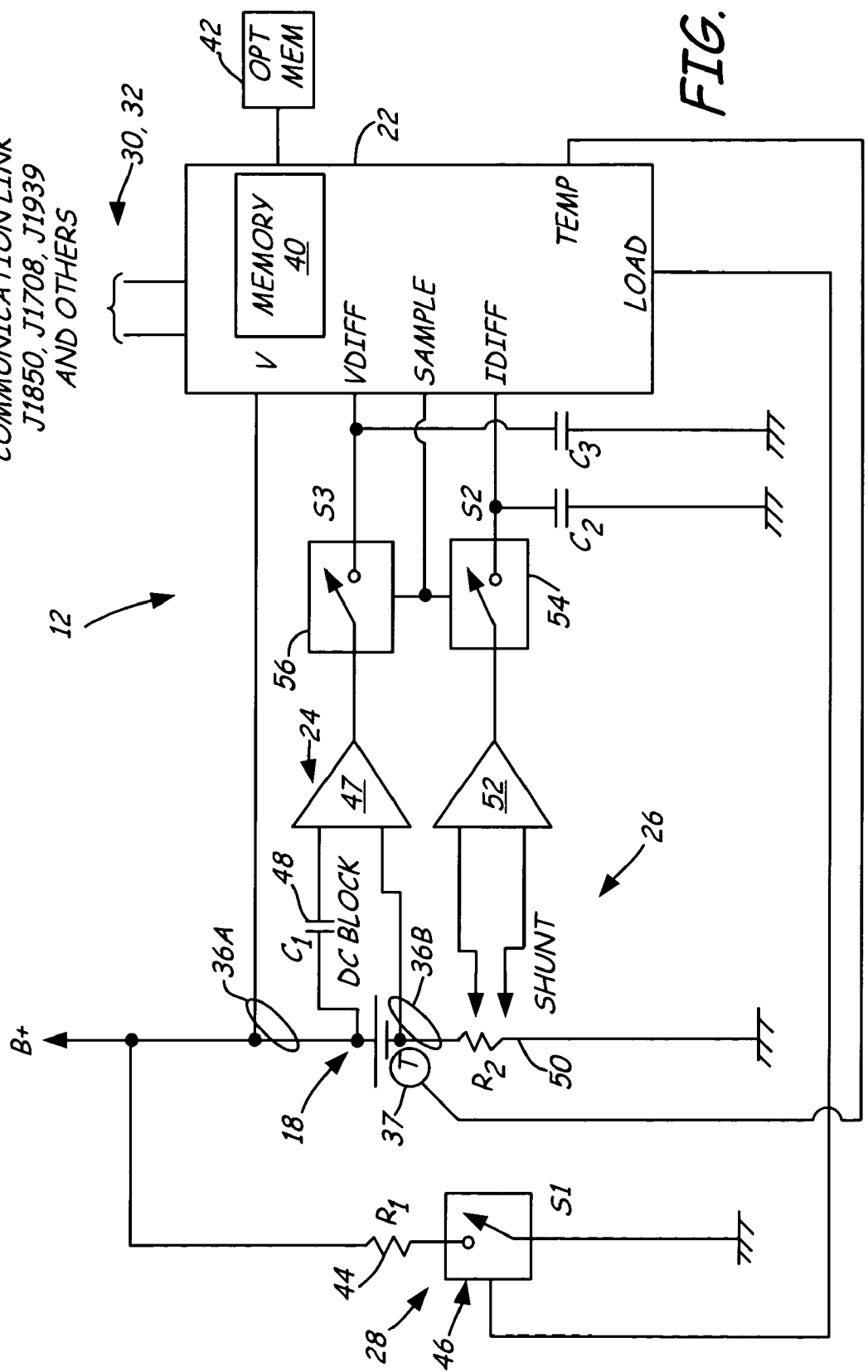
FIG. 2 is a more detailed schematic diagram showing the battery monitor of FIG. 1.

FIG. 2 is a more detailed schematic diagram of battery monitor 12. FIG. 2 shows microprocessor 22 which includes a memory 40. FIG. 2 illustrates I/O 30, 32 with which can be, for specific examples, a communication link in accordance with various standards such as J1850, J1708, J1939, etc. Memory 40 is shown as an internal memory. However, external memory or an optional external memory 42 can also be provided. In general, memory is provided for storing programming functions, ratings, variables, etc. Microprocessor 22 can be a microcontroller or any type of digital circuitry and is not limited specifically to a microprocessor. FIG. 2 illustrates forcing function 28 in greater detail and includes a resistance $R_1$ 44 and a switch $S_1$ 46 controlled by microprocessor 22. Switch 46 can be, for example, a field effect transistor. Voltage sensor 24 is shown as including a differential amplifier 47 coupled to battery 18 through a DC blocking capacitor $C_1$ 48. Shunt 26 is illustrated as a resistance $R_2$ 50, which is coupled to a differential amplifier 52. Switches $S_2$ 54 and $S_3$ 56 are positioned to selectively couple amplifiers 52 and 47, respectively, to microprocessor 22 and are actuated by a sample control line to provide data samples to microprocessor 22. An analog to digital converter can be an integral part of microprocessor 22 or it can be a separate component to digitize the outputs from amplifiers 47 and 52. Capacitors $C_2$ and $C_3$ provide sample and hold circuits.

Forcing function 28 can be formed by a resistance as illustrated in FIG. 2, or by a current sink or through an existing load of the vehicle. Switch $S_1$ 46 can be an FET, or bipolar transistor or can be a mechanical or existing switch in the automotive vehicle. Other types of DC blocking techniques can be used to replace blocking capacitor $C_1$ 48 such as a DC coupled amplifier.

Figure 3:
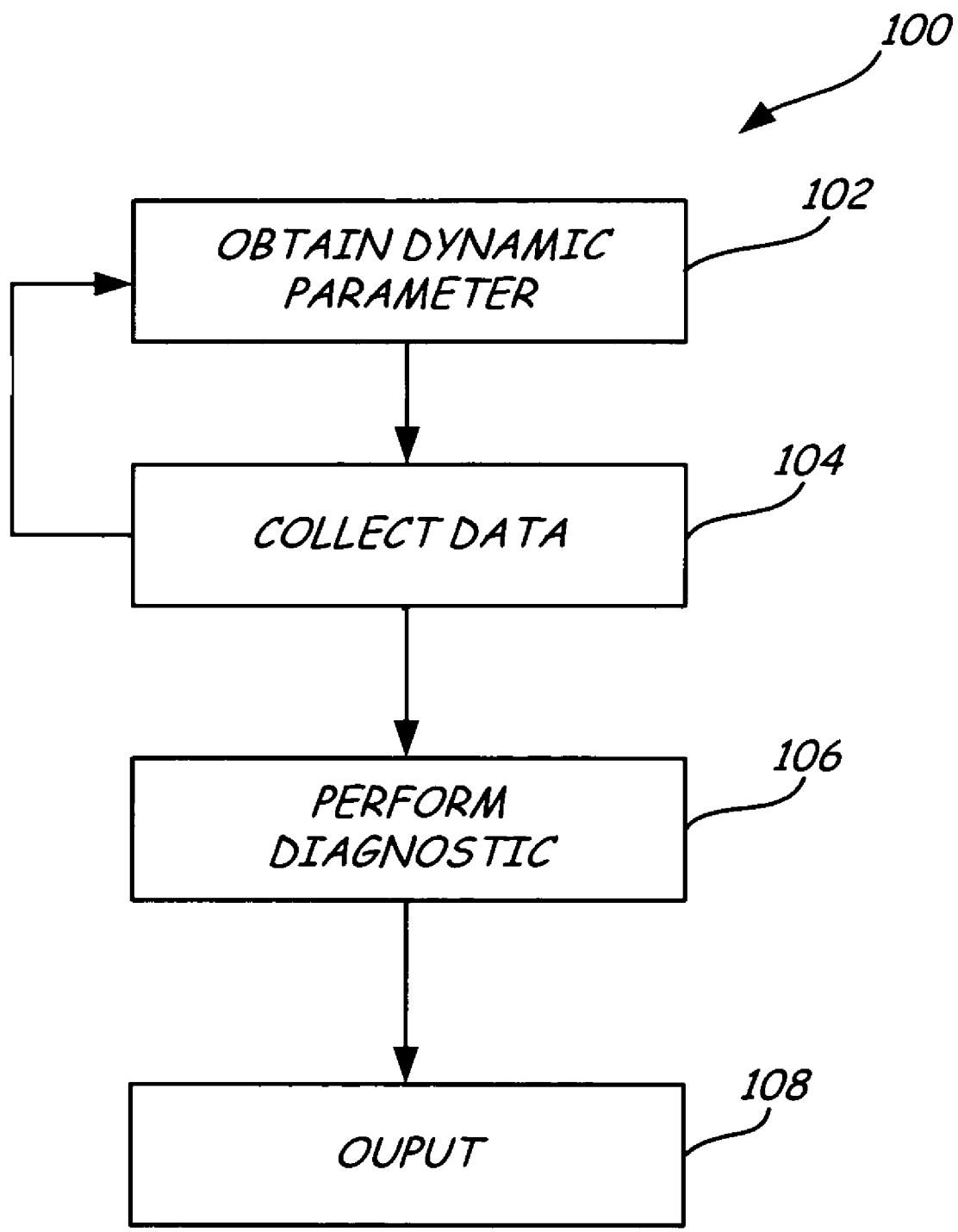
FIG. 3 is a simplified block diagram showing steps in performing diagnostics carried out by a microprocessor of the energy management system.

FIG. 3 is a simplified block diagram 100 showing diagnostic steps performed by microprocessor 22. At blocks 102 and 104, the dynamic parameter(s) for the battery 18 are obtained and at block 104 data is collected. The type of data collected at block 104 can be any type of data used in determining the condition of the battery. For example, the data can be values used for $\Delta V$ and $\Delta I_T$, information related to the type of battery, etc. This information can be stored in memory 40 for subsequent retrieval by microprocessor 22. The data can be collected over any time period and during any type of engine or battery operation. At block 106, microprocessor 22 performs diagnostics based upon the data stored in memory 40. If a battery fault or impending fault is detected, an output can be provided at block 108 such as providing a "service battery soon" indication on the dash of the vehicle 10.

Various aspects of the invention include the particular diagnostics performed by diagnostic block 106. The diagnostics can be simple diagnostics such as a simple if-then rule in which the collected data is compared to various thresholds to provide the diagnostic output. Absolute values of the data can be used for this comparison or various statistical operations can be performed on the data for use in the comparison. For example, averages or standard deviation of the data can be compared to a threshold. The threshold levels can be determined through testing of the vehicle and entered into memory 40 during manufacture. Preferably, when battery 18 is replaced, the thresholds are updated accordingly.

In more advanced embodiments of the diagnostic block 106, microprocessor 22 can perform diagnostics using fuzzy logic, neural networks or artificial intelligence techniques. Neural networks can advantageously be used as they do not require that the battery, alternator and vehicle loads be modeled. Instead, neural networks are capable of learning what "normal" data collected at step 104 should be, and can provide an indication when a pattern of the data is drifting outside of normal operation. Further, the neural network can be "trained" to recognize potential sources of the failure and provide an expected time until the system completely fails. These diagnostic techniques can be selected and implemented such that the operator is warned of an impending failure, prior to the complete failure of the battery 18 or alternator 20.

Figure 4:
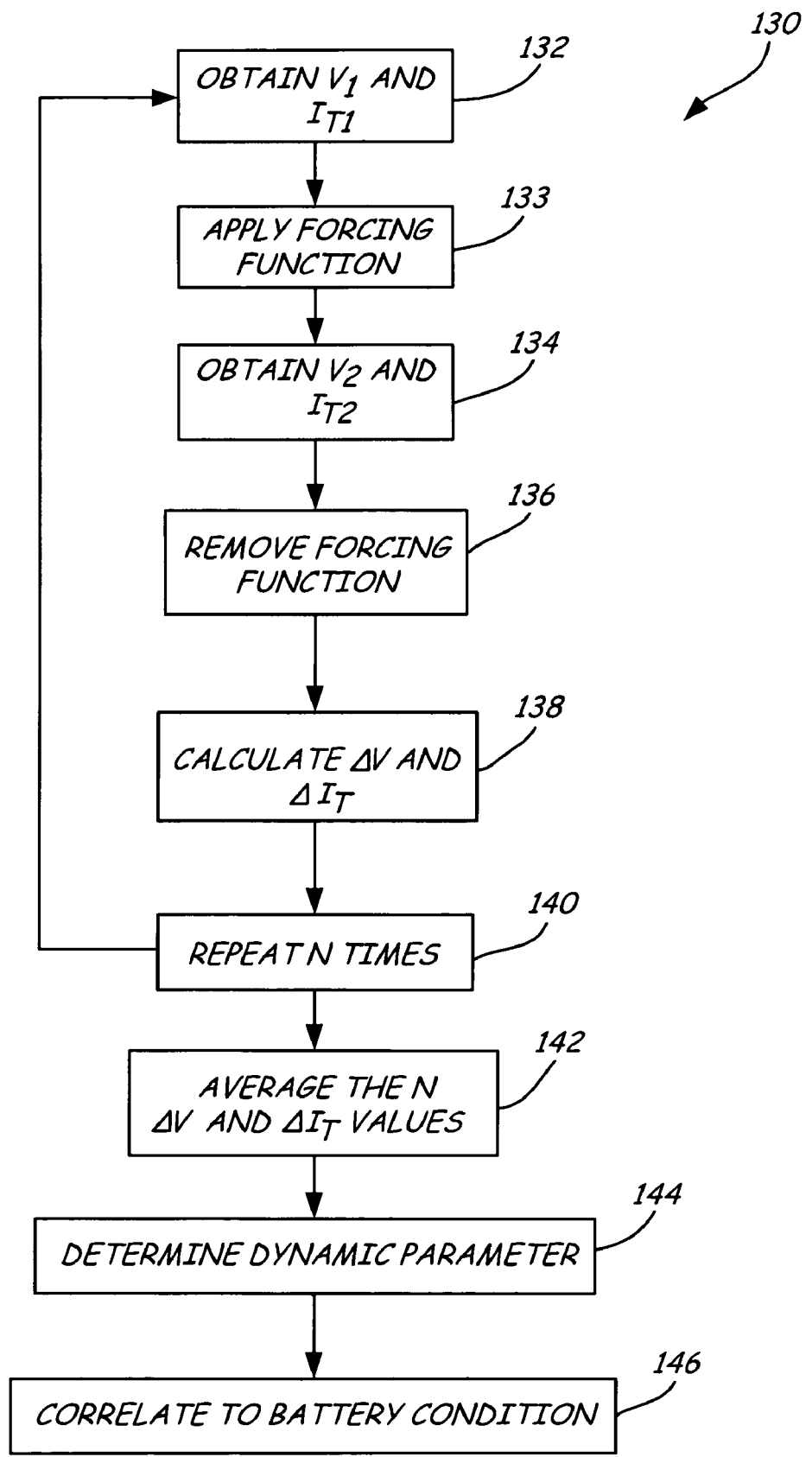
FIG. 4 is a simplified block diagram showing steps in collecting data for use with the present invention.

FIG. 4 is a block diagram 130 showing example steps in accordance with data collection and calculation of a dynamic parameter in accordance with the present invention. Of course, as should be pointed out with respect to all of the flow charts set forth herein, those skilled in the art will recognize that the particular functions of the blocks and the order in which the blocks are executed can be easily rearranged and the invention is not limited to the specific embodiments set forth herein.

In block diagram 130, at block 132 microprocessor 22 obtains an initial voltage $V_1$ across battery 18 using voltage sensor 24 and an initial current $I_{T1}$ through battery 18 using current sensor 26. Next, the forcing function 28 is applied to battery 18 at step 133. At block 134, microprocessor 22 obtains values $V_2$ and $I_{T2}$ with the forcing function applied, and at step 136 the forcing function is removed. Values for $\Delta V$ and $\Delta I_T$ are calculated at step 138. In one example embodiment, the forcing function is applied for a duration of 100 μsec 20 times every second. N values are obtained at block 140. In one example, N is equal to 256. At block 142, the average of $\Delta V$ and $I_{T2}$ for the N samples is calculated and a dynamic parameter for the battery 18 is determined at block 144. This dynamic parameter can be correlated to a condition of the battery at block 146 and displayed on user I/O 32, output through I/O 30 or used to control alternator 20 through alternator control 23.

In one aspect of the invention, the battery monitor performs a state of charge measurement, in real time and regardless of battery polarization, and automatically corrects for the state of health of the battery and the battery temperature. In general, state of health can be determined as a function of the battery conductance and the open circuit voltage across battery 18. For example, the state of health can be determined as:

$$SOH = k_1(G/RATING)*f(V_{oc}) - k_2 \qquad \text{Equation 2}$$

where $k_1$ and $k_2$ are constants which are related to the type of battery, G is the measured conductance of the battery, rating is a rating for the battery and $f(V_{OC})$ is a relationship between the state of charge and the open circuit voltage of the battery as set forth in the aforementioned Champlin and Midtronics, Inc. patents. The state of health will range between 0 and 100%. Using the state of health determined by Equation 2, the state of charge (from 0 to 100%) can be determined in accordance with Equation 3:

$$SOC_{t_2} = 100 * \frac{\left[\int_1^{t_2} i\,dt \int_1^{t_2} e(T)\,dt \int_1^{t_2} e(i)\,dt\right]}{(SOH)(AMP - \text{HOUR CAPACITY})} + SOC_{t_1} \qquad \text{Equation 3}$$

where $t_1$ is the time at which the state of charge is known (i.e., from the period of overcharge, for example), $t_2$ is the present time, i is the current (amps) in or out of the battery at time t, T is the battery temperature, e(T) is the charge acceptance efficiency at temperature T, and e(i) is the charge acceptance efficiency at current i. Of course, Equations 2 and 3 are simply examples of state of health and state of charge measurements and other techniques can be used in accordance with the invention.

Figure 5:
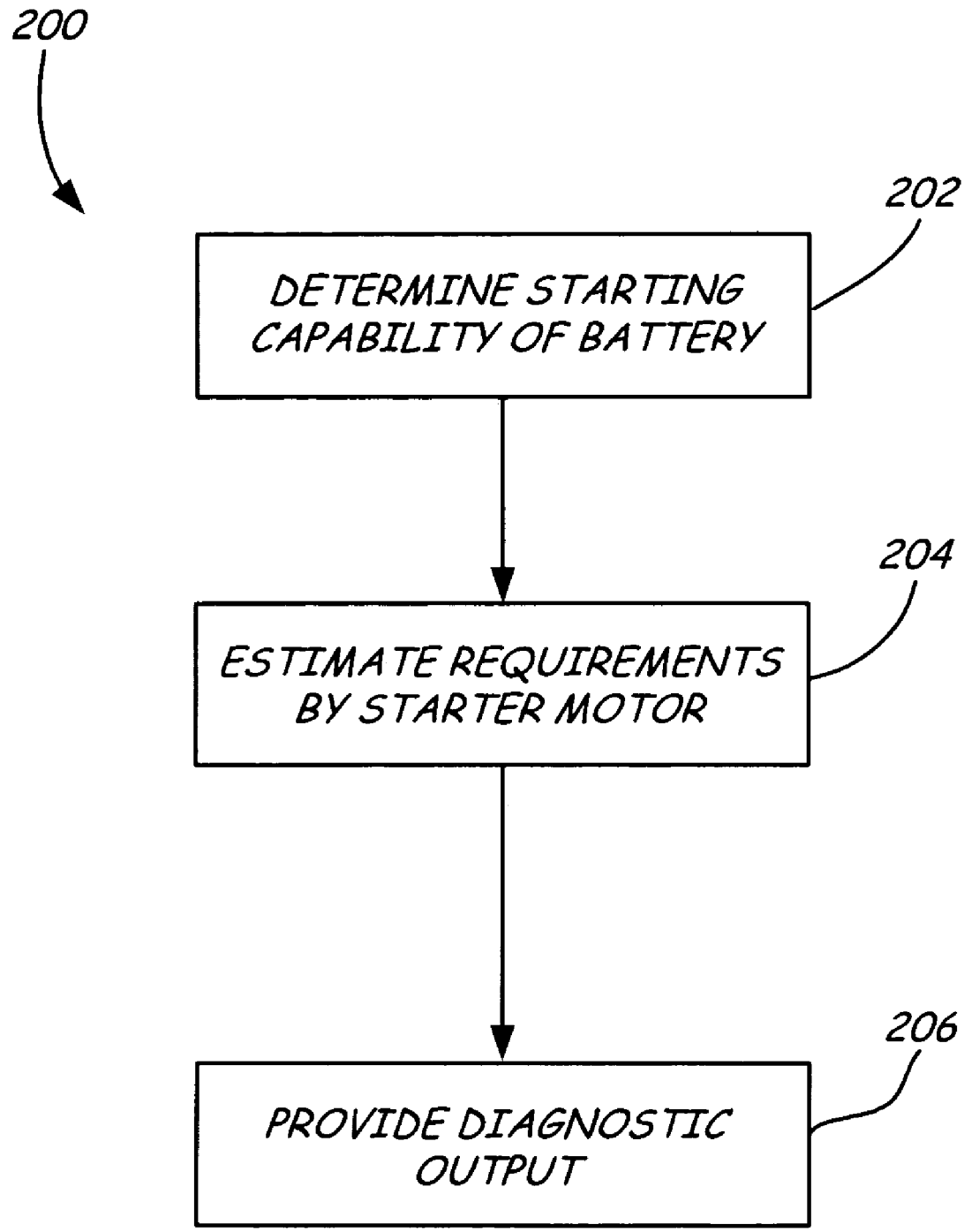
FIG. 5 is a simplified block diagram which illustrates performing diagnostics on a starter motor of the vehicle of FIG. 1.

Using the battery state of charge and the battery state of health, battery monitor 12 can predict the starting capabilities of a starter motor of vehicle 10. For example, by comparing the amount of current measured by current sensor 26 which has been previously been required to start the engine of vehicle 10 for a particular temperature, microprocessor 22 can determine if the current state of charge of the battery for the current state of health at the current temperature will be sufficient to provide enough current to start the engine. The performance and any degradation in the starter motor can also be taken into account by microprocessor 22. For example, if the amount of current required to start the engine has been increasing with time, microprocessor 22 can extrapolate and predict what amount of current will be required to start the engine in the future. FIG. 5 is a simplified block diagram 200 which illustrates steps performed by a microprocessor 22 in diagnosing the starting capability of battery 18. At block 202, microprocessor 22 determines the starting capability of battery 18. For example, the starting capability can be an estimation or measurement of the amount of current which battery 18 can supply over a short duration. At block 204, microprocessor 22 estimates the starting requirements of the starting motor of the engine of vehicle 10. For example, the past requirements of the starter motor can be recalled from memory 40 and any trend can be used to predict what will be required for starting the engine. Other inputs can also be used in this determination such as the current temperature. At block 206, a starter diagnostic output is provided. For example, if it appears that the battery will have difficulty in operating the starter motor for a sufficient duration to start the motor of the vehicle, vehicle loads 14 can be selectively switched off by microprocessor 22 through I/O 30. Additionally, a warning can be provided to an operator through user I/O 32 of an impending problem, prior to its actual occurrence, such that the battery 18 can be replaced.

In another aspect of the invention, microprocessor 22 can be adapt or alter the performance of the engine and/or loads 14 based upon a number of different parameters in order to provide optimal charging to battery 18. For example, microprocessor 22 can interface to a data bus of a microprocessor of the vehicle 10 through I/O 30 to control engine operation.

Alternatively, microprocessor 22 can be the same microprocessor used to control vehicle operation. The microprocessor 22 can adjust the idle speed of the engine, shift points of the transmission and the load placed on the electrical system by some of the loads 14 to increase or decrease the rate of battery charging based upon the expected driving patterns of an operator. For example, if the microprocessor has observed that the vehicle is normally operated for a short duration, the microprocessor 22 can increase the idle speed of the engine and attempt to reduce loads placed on battery 18 to increase the charging rate of battery 18. Further, microprocessor 22 can alter the shift points of the transmission to cause the engine to operate at a high (or lower) speed than normal. The prediction of engine operation can also be based upon time of day and the day of the week such that repeated driving patterns can be accounted for, for example, commuting to work. Further, in vehicles where it is possible to recognize the operator of the vehicle, such as through the seat position memory in a power seat of the vehicle, microprocessor 22 can alter the charging pattern based upon the driving characteristics of a specific driver.

Figure 6:
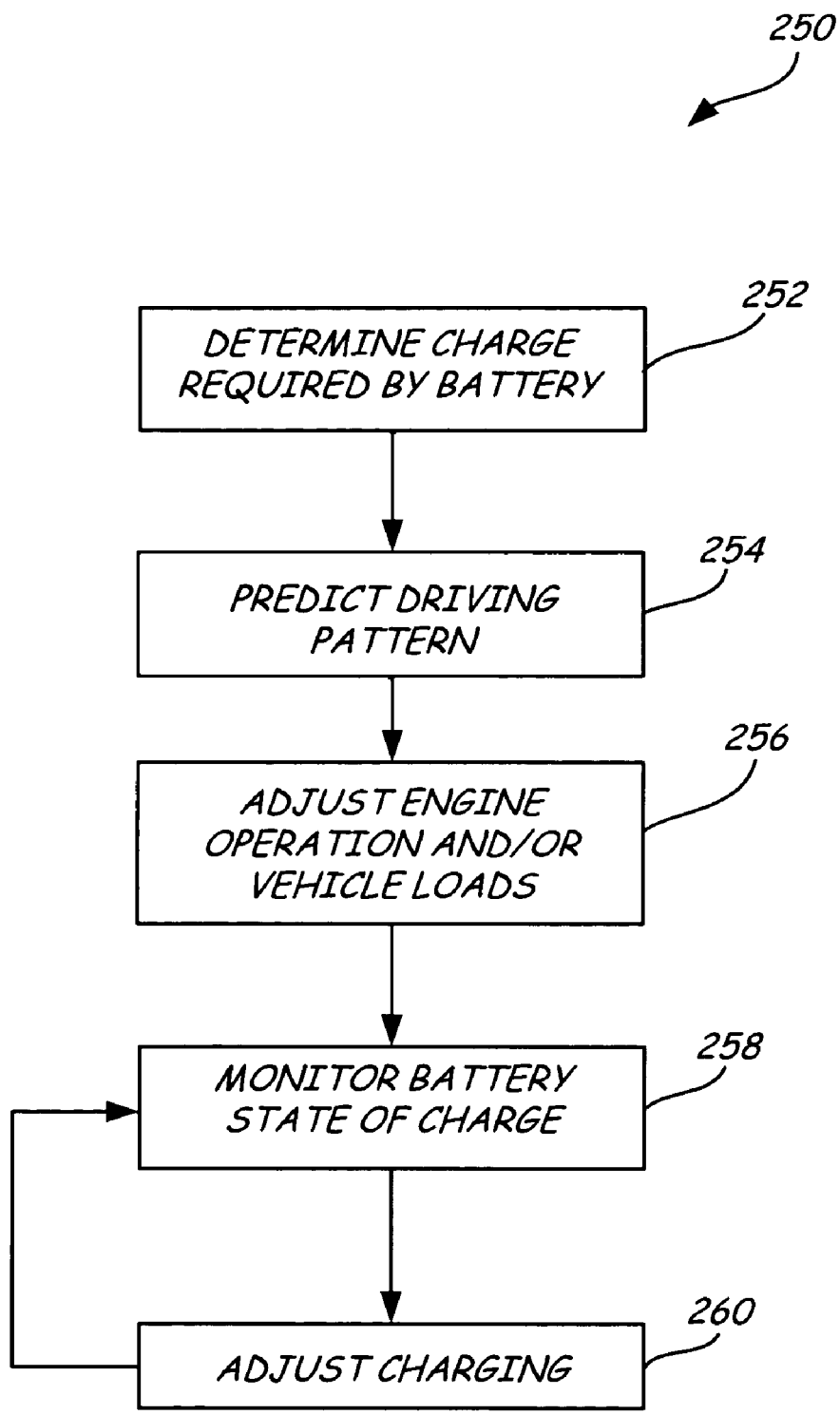
FIG. 6 is a simplified block diagram showing steps related to adjusting the charging profile for charging the battery of the vehicle of FIG. 1.

FIG. 6 is a simplified block diagram flowchart 250 showing steps performed by microprocessor 22 in adjusting engine speed or loads to control the charge in battery 18. At block 252, microprocessor 22 determines the charge required by battery 18 to become fully charged, this determination can be based upon a measurement of the current charge level of battery and a determination of the maximum amount of charge that battery 18 can hold, for example, as a function of the state of health of battery 18. At block 254, microprocessor 22 predicts the expected driving pattern for the upcoming engine use. At block 256, microprocessor 22 adjusts the engine operation and/or vehicle loads 14 in order to optimize the charging of the battery 18 based upon the charge required as determined at step 252 and the driving pattern predicted at step 254. During engine operation, microprocessor 22 continues to monitor the battery state of charge at block 258 and adjusts the charging accordingly at block 260. Once battery 18 has been fully charged, the microprocessor 22 can reduce the charging rate as appropriate.

If the drive cycle is, or has tendency to be, insufficient to charge the battery 18, microprocessor 22 can provide an output to an operator through user I/O 32 to indicate that either the vehicle must be driven for an extended period of time or an alternative charging method be used to charge battery 18. An indication can also be provided as to a prediction regarding how many further such drive cycles can be supported by the battery 18 before it will have insufficient remaining charge to start the vehicle.

Figure 7:
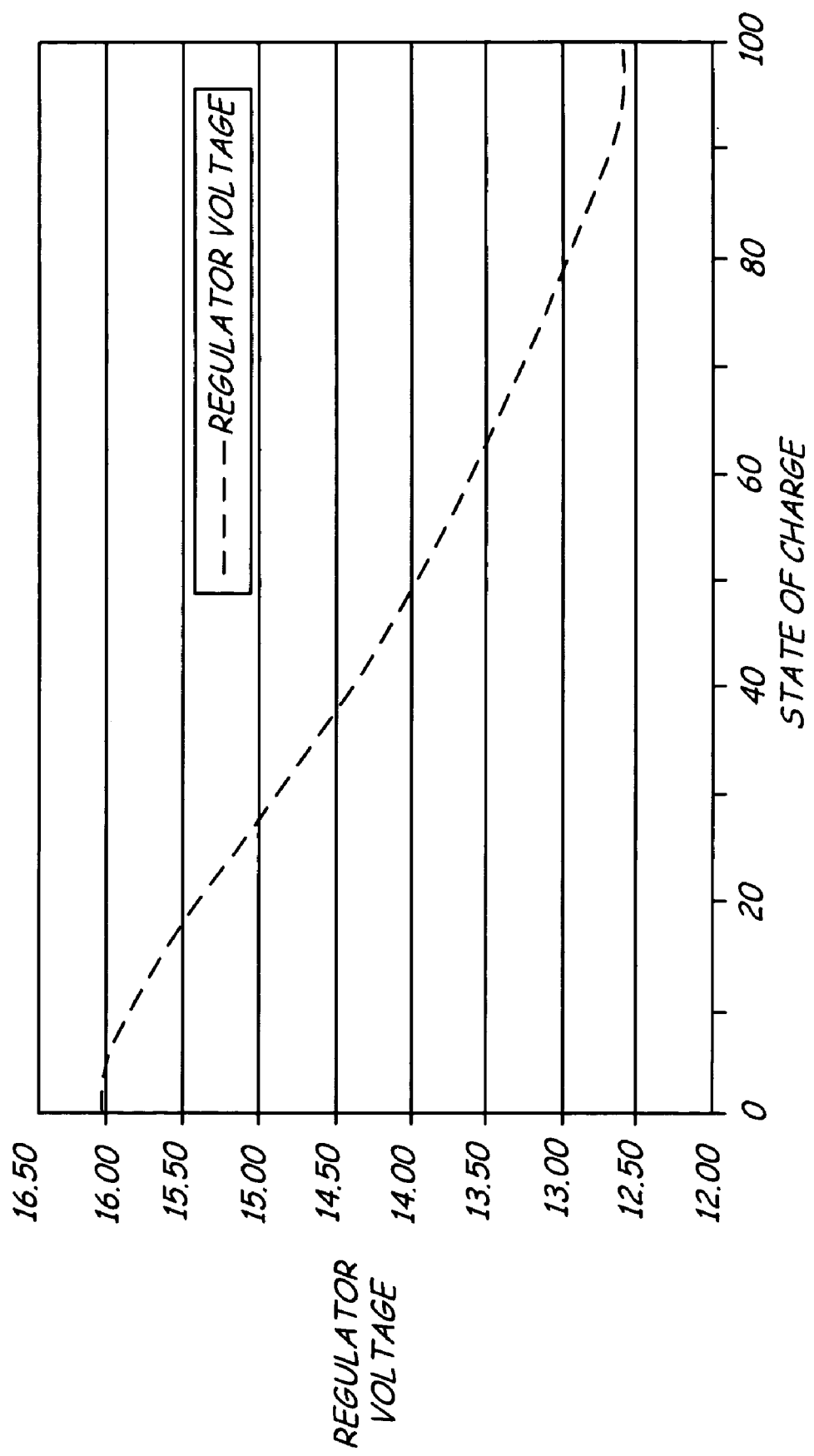
FIG. 7 is a graph which illustrates one sample curve of regulator voltage output versus state of charge for the battery of FIG. 1.

As discussed above, in one aspect of the present invention, the output from the alternator 20 is adjusted based upon the state of charge and/or the state of health determination(s). FIG. 7 is a graph showing the regulator voltage output from alternator 20 as a function of the state of charge of battery 18. As illustrated in FIG. 7, microprocessor 22 reduces the voltage output from alternator 20 as the state of charge of battery 18 increases to 100% charge. The particular profile can be adjusted to a specific battery, alternator and/or engine configuration or to the driving characteristics of an operator. Such a system can significantly reduce or eliminate overcharging of battery 18 and the generation of excessive heat. Further, such a technique can be used to reduce or eliminate the undercharging of battery 18. Additionally, by adjusting the voltage based upon the state of charge, battery 18 and system component life will increase. For example, vehicle loads 14 will be exposed to over voltages for a reduced amount of time. This also allows the various systems components to be optimized for particular charging requirements or voltage levels. In general, the output of the alternator 20 can be reduced and the battery capacity required for a particular vehicle can be reduced because battery charge will be more efficiently maintained. This can reduce overall vehicle weight and improve vehicle mileage. Further still, IR (current-resistance) type losses in the electrical system and overcharging will be reduced thereby reducing the load on the vehicle engine and improving efficiency of the vehicle. In general, this technique will improve vehicle reliability by reducing heat due to excessive IR losses, increasing battery life, providing early detection of impending battery failure and insuring proper vehicle operation even with after market batteries which are used to replace the original battery.

If such a system is implemented when the vehicle is originally manufactured, monitor 12 allows battery management over the entire life of the vehicle. This can be both during assembly and delivery of the vehicle as well as during the lifespan of actual vehicle operation. Additionally, one aspect includes a storage battery 18 with rating information carried in a computer storage device such as a digital memory within a housing of the battery. This data can be communicated to monitor 12 through I/O 30. In one aspect, the electrical connections to the battery are also used as a data communication bus such that monitor 12 can communicate with the storage device in battery 18. The storage device can also be used to store the history, such as the charging and usage history, of battery 18.

Battery monitor 12 can monitor and diagnose operation of alternator 20. For example, a typical alternator provides a multiphase output. By monitoring the data points collected and stored in memory 40, microprocessor 22 can observe the loss of one or more phases in the alternator's output. Similarly, the failure of a rectifying diode in alternator 20 can be detected by microprocessor 22 by observing an asymmetrical ripple pattern. Microprocessor 22 can provide an output to an operator through user I/O 32 such as a "service alternator soon" output. This information can also be communicated to the vehicle microprocessor through I/O 30.

I/O 30 is shown in schematic form and can be any type of input or output and represents, in some embodiments, multiple input(s) and output(s). Various examples of inputs and outputs include a connection to a databus of the vehicle, a connection to a databus adapted to couple to a diagnostic device such as that provided in service equipment, a connection to a remote vehicle monitoring system, such as one that is capable of coupling through a cellular phone connection of the vehicle. In such an embodiment, the vehicle is capable of recording and reporting information to a remote service such as an emergency assistance service or a service provided to monitor the operation of the vehicle and suggest that maintenance be provided. Various types of inputs and outputs can be provided through direct connections or through non-physical connections such as radio frequency or infrared communication techniques. The particular form of the data and standard used for the inputs and outputs can be selected as proprietary or industry standards. Microprocessor 22 can also be capable of providing advanced reporting and control functions through the use of standardized interfaces such as are available through HTML, XML, or various known or proposed alternatives. In such an embodiment, information collected by microprocessor 22 can be viewed through a "web page" interface provided by a browser. Such an embodiment is advantageous because it can provide a user input/output such as user I/O 32 in a standardized form such that it can be viewed or controlled through many types of standardized devices. In such an embodiment, information can be reported to, or the monitor 12 can be controlled, from a remote location. Additionally, if the vehicle 10 includes a browser type interface which may become commonly available in vehicles, the microprocessor 22 can be controlled and communicate through the vehicle's browser. In one aspect, vehicle monitor includes an IP (Internet Protocol) address such that it is capable of communicating in accordance with the Internet Protocol. When coupled to, for example, a cellular telephone connection of the vehicle, the battery monitor 12 is capable of being monitored and controlled from a remote location coupled through the Internet. However, as mentioned above, such an interface also provides a simple technique for interfacing the monitor 12 with a local computer in the vehicle and displaying information from the monitor 12 for use or control by an operator.

Through the use of the data collected by microprocessor 22 and memory 40, microprocessor 22 is also capable of detecting the imminent failure of the starter motor of the vehicle. For example, by monitoring the voltage drop through the system during starting, microprocessor 22 can determine the average time to start the engine and the average and peak currents required during starting. Changes in these, or other, measurement values can indicate a degrading starter motor. Upon detection of an impending failure, a "service starter motor soon" indication can be provided to an operator through user interface 32.

Microprocessor 22 can provide an indication that the battery 18 has insufficient capacity or substandard performance and alert an operator accordingly. For example, upon power up, such as that which occurs when battery 18 is replaced, microprocessor 22 can measure the capacity of the battery 18 and provide an indication to the operator if the capacity is less than a threshold level determined by the vehicle manufacturer and stored in the memory of the vehicle computer system.

Microprocessor 22 can generate an audit code (or a warranty code) in response to the various tests and data collected. Such codes are described in U.S. Pat. No. 6,051,976, issued Apr. 18, 2000, entitled METHOD AND APPARATUS FOR AUDITING A BATTERY TEST which is assigned to the present assignee and is incorporated herein by reference. In such an embodiment, microprocessor 22 encodes data collected or obtained during its operation. For example, raw data related to a battery test can be obtained and/or the ultimate result of the battery test and subsequently encoded by microprocessor 22. The encoding can be a simple transposition cipher in which the locations and values of various bytes of information are rearranged. Such a code can be designed to prevent falsification of data which can occur where unscrupulous individuals are attempting to submit a falsified warranty claim for a failed component to a manufacturer. This coding technique allows the manufacturer to verify information when a warranty is submitted. Additionally, the information can be used to track operator error and assist in identification and isolation of component failure in order to redesign the components and reduce such failures.

In another aspect, microprocessor 22 is capable of automatically calibrating the measurements obtained from voltage sensor 24 and current sensor 26. Using this aspect of the invention, microprocessor 22 can perform automatic or periodic calibrations to maintain accuracy over the lifespan of the vehicle. Automatic calibration can be provided by selectively switching in calibrated elements having known temperature and time drift characteristics, and using the measured data to correct for instrumentation gains and offsets. For example, a known resistance or voltage source can be selectively coupled to amplifiers 47 or 52. Any offset values from these known values can be stored in memory 40 and used by microprocessor 22 to compensate for errors in measurements.

With the present invention, any polarization of the battery 18 such as that which can result from charging or starting operations, does not produce errors in the measurements performed by microprocessor 22. Specifically, any such errors are eliminated by use of a real-time state of charge algorithm that is independent of the real time battery terminal voltage.

When the engine of vehicle 10 is not operating, microprocessor 22 can enter a sleep mode to reduce current draw and the resultant discharge of battery 18. If desired, microprocessor 22 can periodically "wake up" to perform tests or monitor some aspect of the electrical system of vehicle 10.

A loose or corroded connection to battery 18 can be detected by microprocessor 22 by observing a sudden increase in the resistance across battery 18. An error can be provided to an operator through user interface 32 to alert the operator of the degraded connection.

Microprocessor 22 can also perform diagnostics on the electrical system of vehicle 12 when the engine is not operating. For example, microprocessor 22 can monitor the current being drawn by loads 14 when the engine is not running using current sensor 26. For example, microprocessor 22 can compare the rate of current draw, over a selectable sample period with a threshold stored in memory 40. If the measured rate exceeds the threshold, there may be a fault in the electrical system of the vehicle. Similarly, a small but constant current drain can also indicate a fault which could lead to the discharge of battery 18. Microprocessor 22 can provide an indication to the user through user interface 32 that excessive current draw has occurred while the engine is off. Such current draw can lead to rapid discharge of battery 18 and prevent starting.

Current sensor 26 can also be used by microprocessor 22 to monitor the current flowing into and out of battery 18. The summation of this current, taken over a time period (i.e., integration) can provide an indication that the battery is not receiving sufficient charge, or can provide an indication of the total charge received by battery 18. This information can be displayed to an operator through user I/O 32. Additionally, the information can be provided on I/O 30. If the information indicates that the battery 18 is not receiving sufficient charge, steps can be taken as discussed above, to increase the charging rate of battery 18.

In one embodiment, microprocessor 22 stores information in memory 40 related to the model number, and/or serial number, capacity or other information related to battery 18. In such an embodiment, battery monitor 12 can be a physical part of battery 18 such that battery specific information can be programmed into memory during manufacture. The battery monitor 12 can provide an output to an operator through a display or other type of output device which is physically located on the battery 18. Additionally, the display or user I/O 32 can be located within the vehicle. Input/output 30 can be configured to couple to the databus of the vehicle. For example, the battery 18 can include a data plug adapted to plug into the databus of the vehicle such that monitor 12 can exchange information through the databus. Microprocessor 22 can then report this information to the databus of the vehicle using input/output 30. This allows the microprocessor of the vehicle the ability to perform advanced diagnostics and monitoring as the specific battery type is known.

In the above-described embodiments, shunt 26 is coupled to a PCB of energy management system 12 in a manner described below in connection with FIG. 8, for example. For simplification, other components of the energy management 12 such as microprocessor 22, capacitors $C_1$, $C_2$ and $C_3$, amplifier 47, etc. (described earlier), which are also mounted on the PCB are not shown in FIG. 8.

Figure 8:
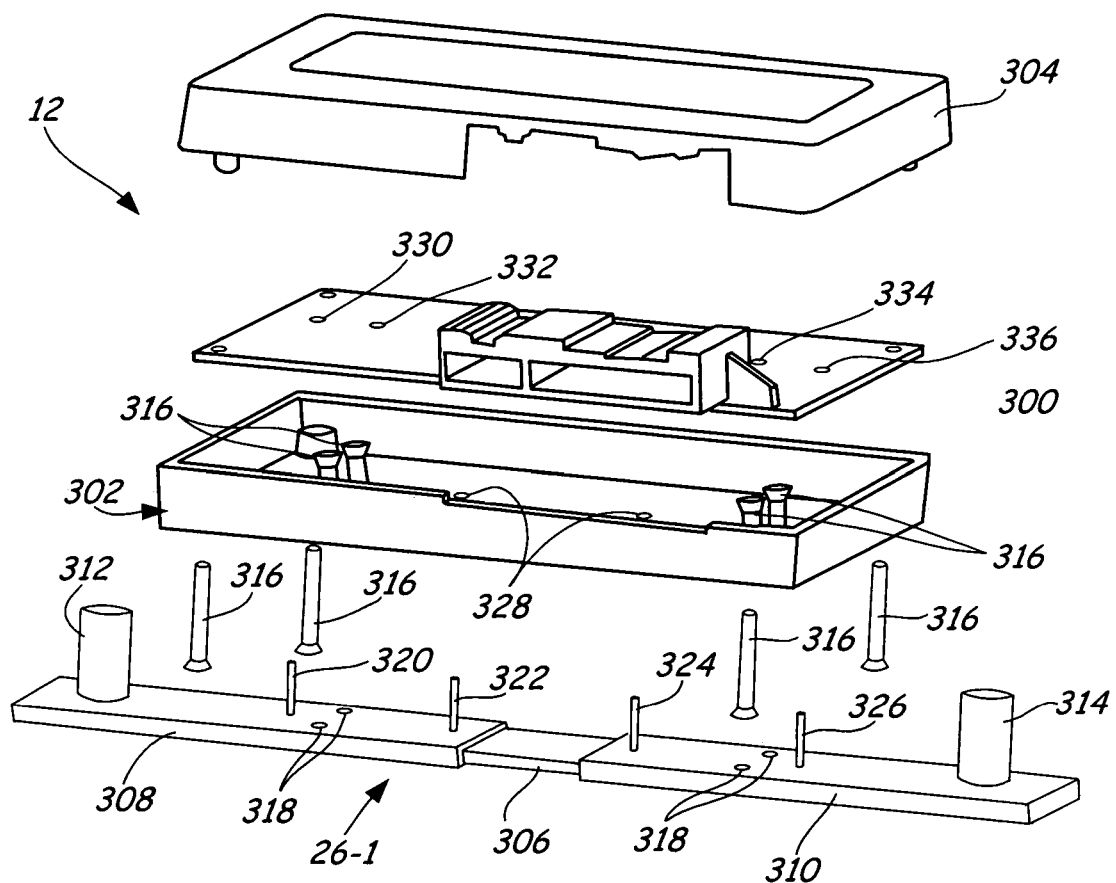
FIG. 8 is an exploded view of an energy management system that includes a shunt, which is electrically coupled to a printed circuit board (PCB) of the energy management system shown in FIG. 1 or 2, with the help of flexible electrical connectors, in accordance with an embodiment of the present invention.

FIG. 8 is an exploded view of energy management system 12 that includes a shunt 26-1, which is electrically coupled to a PCB 300 of the energy management system 12 with the help of flexible electrical connectors in accordance with an embodiment of the present invention. As can be seen in FIG. 8, energy management system 12 includes a housing with a base 302 and a top cover 304. PCB 300 (with mounted components such as microprocessor 22, capacitors $C_1$, $C_2$ and $C_3$, amplifier 47, etc. (not shown in FIG. 8)) is included within the housing. In the embodiment of the present invention shown in FIG. 8, shunt 26-1 is mounted below (i.e., on a lower surface of) base 302. Shunt 26-1 includes a shunt resistor 306 and bus bars 308 and 310 that are coupled to ends of shunt resistor 306. Shunt 26-1 also includes posts 312 and 314 that are coupled to, and extend in an upward direction from, bus bars 308 and 310, respectively. Shunt 26-1 is coupled to base 302, and thereby held in place, with the help of screws, bolts or other suitable fasteners (such as 316), which are known in the industry or are developed in the future. In embodiments of the present invention, fasteners 316 are inserted into grooves 318 in bus bars 308 and 310 and corresponding grooves in base 302. In accordance with an embodiment of the present invention, flexible electrical connectors 320, 322, 324 and 326 are coupled to bus bars 308 and 310, in positions shown in FIG. 8, such that they extend in an upward direction from bus bars 308 and 310. Electrical connectors 320, 322, 324 and 326 are inserted into properly positioned grooves (such as 328) in base 302 and soldered to connection points (or regions) 330, 332, 334 and 336 on PCB 300. Soldering can be carried out on an upper or lower surface of the PCB. Flexible electrical connectors 322 and 324, which are proximate to, and on either side of, shunt resistor 306 are soldered to connection points 332 and 334 on PCB 300, which are in turn electrically coupled to inputs of differential amplifier 52 (FIG. 2). Flexible electrical connector 320, which is soldered to connection point 330, is one of the electrical connectors used for the application of a current pulse (forcing function), which was described earlier. Flexible electrical connector 330 is a part of Kelvin connection 36B (FIGS. 1 and 2). Flexible electrical connector 326, which is soldered to connection point 336, is electrically coupled to ground. Shunt post 312 is used to receive an electrical connection from battery 18 (FIGS. 1 and 2) and shunt post 314 may be connected to ground. In some embodiments of the present invention, connector 326 may be excluded and the ground connection may be provided only with the help of shunt post 314. In some embodiments, a clamp (not shown) may be utilized to couple to the bus bar 308 to battery 108. In such embodiments, shunt posts 312 and 314 may be eliminated.

The housing (base 102 and top cover 104) can be formed of any suitable insulating material, such as plastic. Flexible electrical connectors 320, 322, 324 and 326 may be formed of copper or any other suitable electrically conductive metal/material.

As mentioned above, in addition to forming a part of the housing, base 302 provides support for shunt 26-1 and also serves as an insulating member, between shunt 26-1 and PCB 300, which only allows for the passage of flexible electrical connectors 320, 322, 324 and 326 through grooves 328. In should be noted that, instead of base 302 serving as the grooved insulating member between shunt 26-1 and PCB 300, an additional insulating member, which includes grooves and that can support shunt 26-1 can be employed. In such embodiments, PCB 300, the additional insulating member (not shown) and shunt 26-1 will all be substantially contained within the housing. In other words, in such embodiments, PCB 300, the additional insulating member and shunt 26-1 will be between base 302 and top cover 304.

Figure 9:
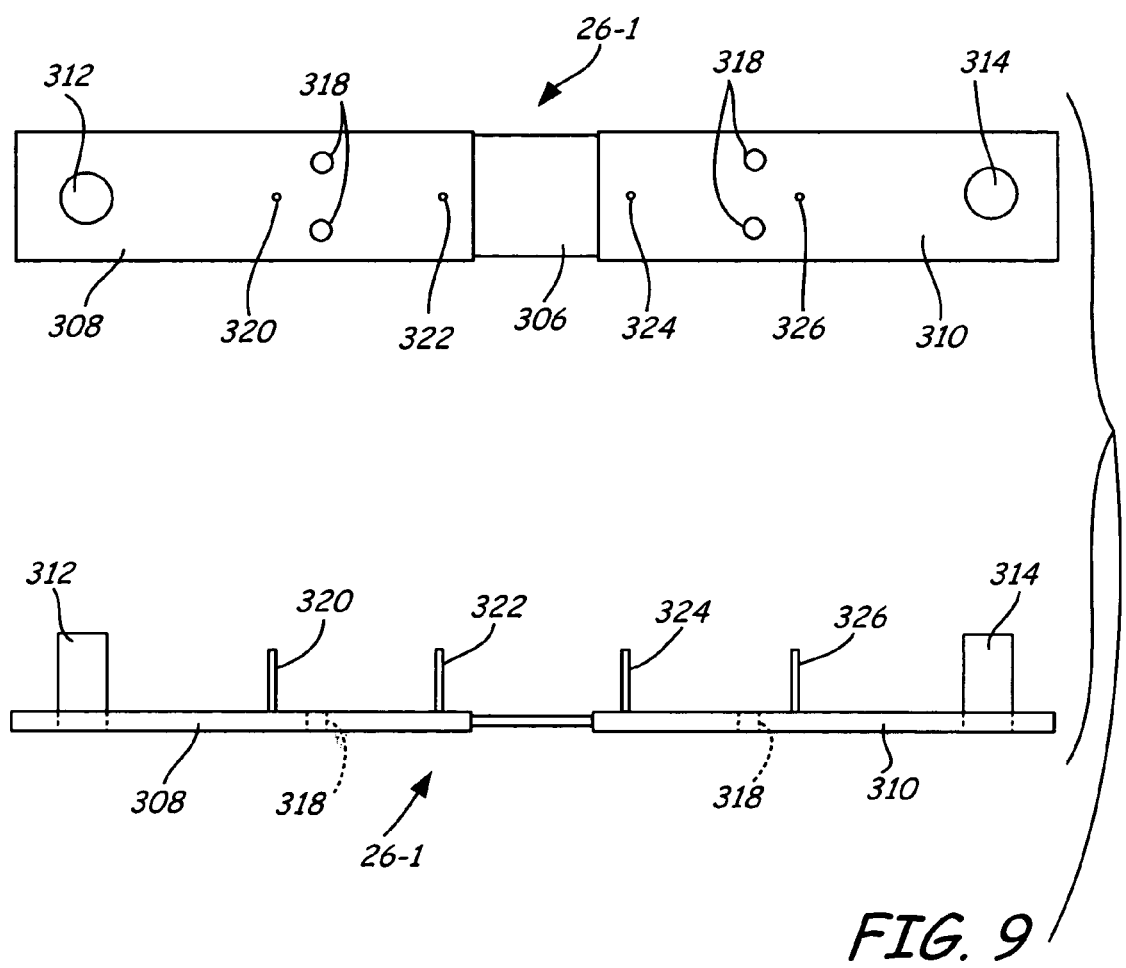
FIGS. 9, 10 and 11 are diagrammatic illustrations of shunts configured for attachment to the PCB of the energy management system shown in FIG. 1 or 2 in accordance with embodiments of the present invention.
Figure 10:
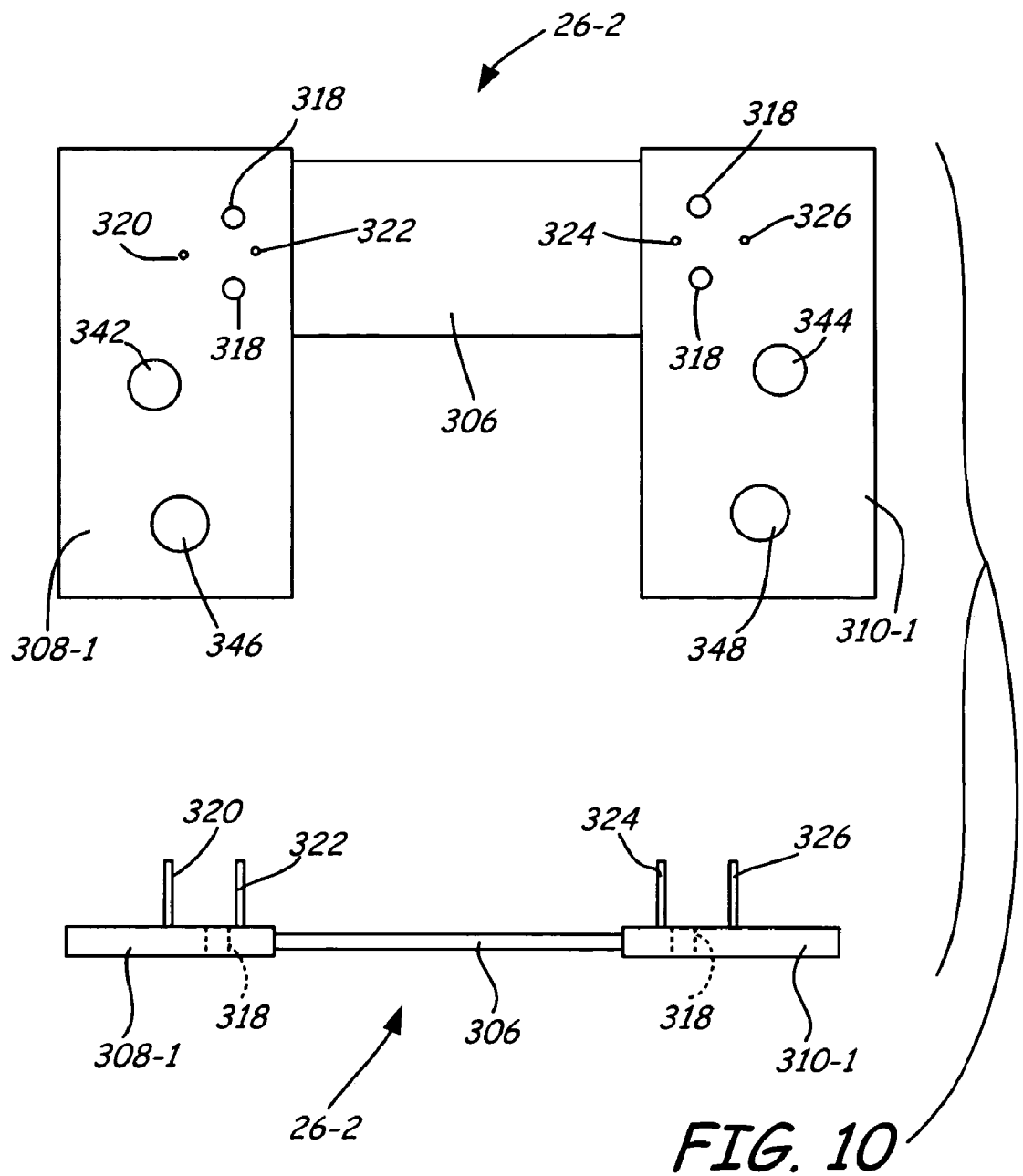

To better illustrate the different components of shunt 26-1, a top and profile view of shunt 26-1 is shown in FIG. 9. As can be seen in FIGS. 8 and 9, shunt 26-1 is substantially rectangular in shape. However, in general, shunts employed with the present invention may be of any suitable shape. For example, FIG. 10 illustrates a top and profile view of a U-shaped shunt 26-2 (shown as an inverted U in the top view in FIG. 10). Here bus bars 308-1 and 310-1 are substantially parallel to each other. Here, fastening members which couple shunt 26-2 to the housing can be inserted through grooves 342 and 344. Further, grooves 346 and 348 are included in bus bars 308-1 and 310-1 instead of posts 312 and 314 which are included in bus bars 308 and 310 in shunt 26-1 (shown in FIGS. 8 and 9). Connection cables from battery 18 and ground can be coupled to shunt 26-1 by insertion into grooves 346 and 348.

Figure 11:
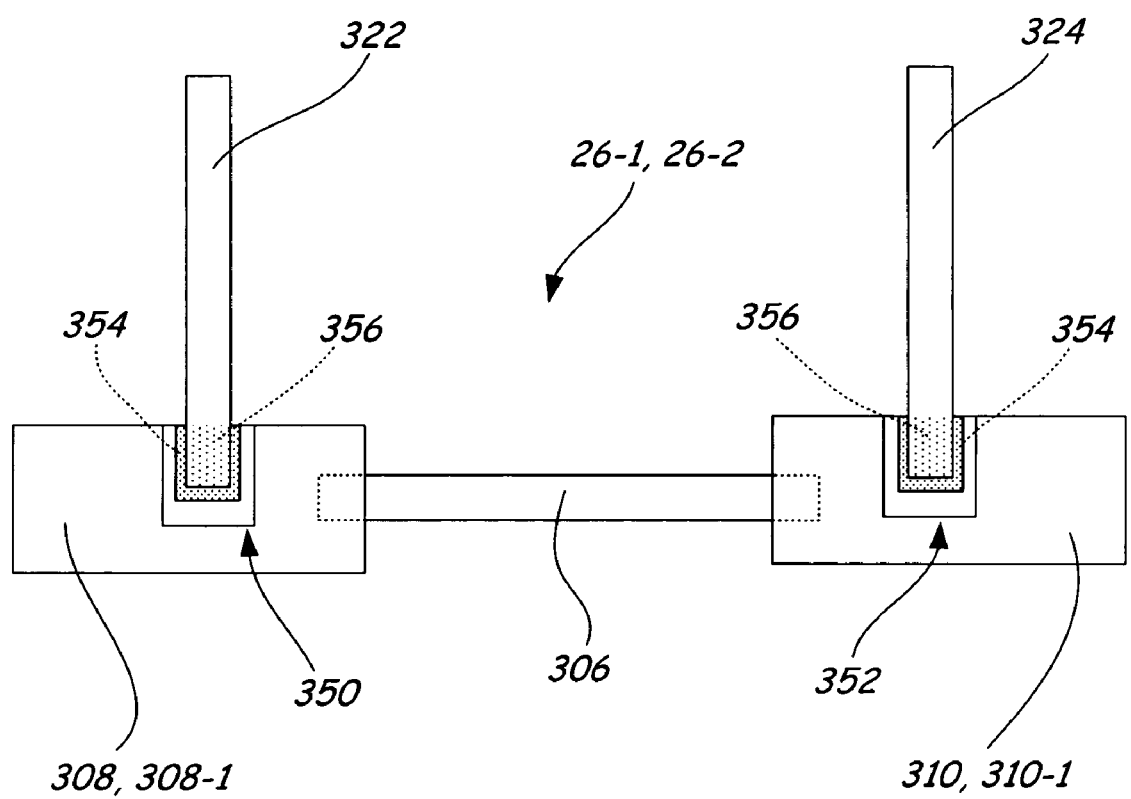

FIG. 11 is a diagrammatic view showing techniques for coupling flexible electrical connectors (such as 322 and 324) to bus bars (such as 308 and 310, 308-1 and 310-1) of the shunt (such as 26-1, 26-2). As can be seen in FIG. 11, in some embodiments, grooves (such as 350 and 352), that are sized to receive the flexible electrical connectors (such as 322 and 324), are included in the bus bars (such as 308 and 310, 308-1 and 310-1). In some embodiments, grooves 350 and 352 are annular threaded grooves and flexible electrical connectors 322 and 324 include threads such that the connectors 322 and 324 can be screwed into grooves 350 and 352. Reference numeral 354 represents threads within grooves 350 and 352 and reference numeral 356 represents threads on flexible electrical connectors 322 and 324. In other embodiments, grooves 350 and 352 and flexible electrical flexible electrical connectors 322 and 324 may interlock in a press fit. In general, any suitable technique can be employed to couple the flexible electrical connectors 322 and 324 to the bus bars (such as 308 and 310, 308-1 and 310-1).

Figure 12:
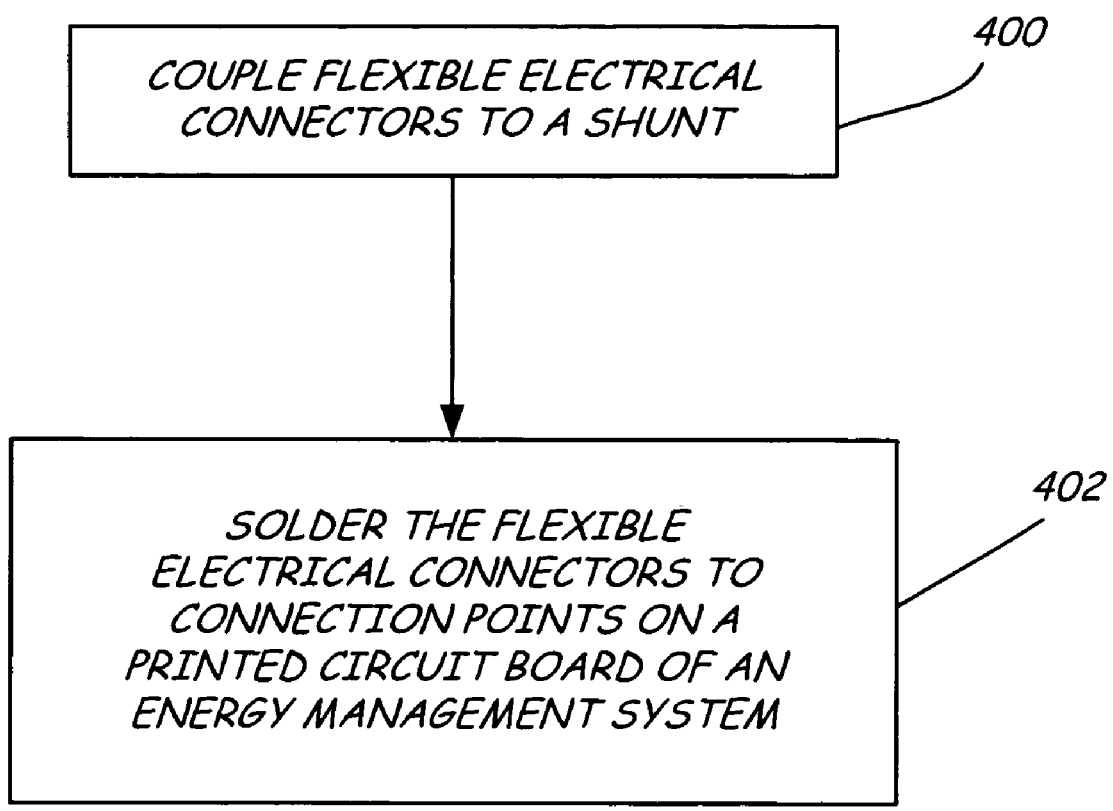
FIG. 12 is a simplified block diagram of one method embodiment of the present invention.

FIG. 12 is a simplified block diagram showing steps of a method of coupling a shunt to a PCB of an energy management system utilized in an automobile in accordance with an embodiment of the present invention. At step 400, flexible electrical connectors are coupled to the shunt. At step 402, the flexible electrical connectors are soldered to connection points on the PCB of the energy management system. Different techniques, some of which are set forth above, can be employed to carry out the steps shown in the block diagram of FIG. 12 while maintaining substantially the same functionality without departing from the scope and spirit of the present invention.

Although the present invention has been described with reference to preferred embodiments, workers skilled in the art will recognize that changes may be made in form and detail without departing from the spirit and scope of the invention. It should be noted that the above-described method for connecting the shunt to the PCB can be relatively easily automated using any suitable fixture that is capable of appropriately positioning the PCB and the shunt and carrying out the above method steps.

What is claimed is:

1. An apparatus for monitoring the condition of a storage battery while the storage battery is coupled in parallel to an electrical system of an operating vehicle, comprising:
   a first electrical connection directly coupled to a positive terminal of the battery;
   a second electrical connection directly coupled to a negative terminal of the battery, the first and second electrical connections coupled to a voltmeter to measure a time varying voltage across the battery;
   a third electrical connection directly coupled to the positive terminal of the battery;
   a fourth electrical connection directly coupled to a negative terminal of the battery, the third and fourth electrical connections coupled to a forcing function having a time varying component;
   a printed circuit board (PCB);
   a shunt current sensor electrically in series with the battery, wherein the shunt current sensor is mounted on the PCB by:
      (a) coupling flexible electrical connectors to the shunt current sensor; and
      (b) soldering the flexible electrical connectors to connection points on the PCB;
   a microprocessor, mounted on the PCB, configured to determine the condition of the battery as a function of a dynamic parameter of the battery based upon the measured voltage, the forcing function and a current sensed by the shunt current sensor, and
   an insulating member between the PCB and the shunt, the insulating member comprising grooves through which the flexible electrical connectors are inserted, wherein the insulating member is a part of a housing that encloses the printed circuit board.

2. The apparatus of claim 1 wherein the insulating member is a base of the housing that encloses the printed circuit board.

3. The apparatus of claim 1 wherein the shunt comprises a shunt resistor and bus bars, and wherein the connecting the flexible electrical connectors to the shunt comprises connecting the plurality of flexible electrical connectors to the bus bars.

4. The apparatus of claim 3 wherein the bus bars comprise grooves, and wherein connecting the flexible electrical connectors to the bus bars comprises inserting the flexible electrical connectors into corresponding grooves in the bus bars.

5. The apparatus of claim 3 wherein the bus bars comprise threaded grooves and wherein connecting the flexible electrical connectors to the bus bars comprises screwing the flexible electrical connectors into corresponding threaded grooves in the bus bars.

6. The apparatus of claim 1 wherein the flexible electrical connectors comprise copper.

7. The apparatus of claim 1 wherein a number of flexible electrical connectors are at least two flexible electrical connectors.

8. The apparatus of claim 1 wherein a number of flexible electrical connectors are four flexible electrical connectors.

* * * * *